(12) United States Patent
Blish et al.

(10) Patent No.: US 8,946,663 B2
(45) Date of Patent: Feb. 3, 2015

(54) SOFT ERROR RESISTANT CIRCUITRY

(75) Inventors: Richard C. Blish, Saratoga, CA (US); Timothy Z. Hossain, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/471,854

(22) Filed: May 15, 2012

(65) Prior Publication Data
US 2013/0306885 A1 Nov. 21, 2013

(51) Int. Cl.
*H01L 23/552* (2006.01)

(52) U.S. Cl.
USPC .............. 250/515.1; 250/505.1; 257/428; 257/429

(58) Field of Classification Search
USPC ......... 250/505.1, 515.1, 518.1; 257/414, 428, 257/429
See application file for complete search history.

(56) References Cited

U.S. PATENT DOCUMENTS

| | | | |
|---|---|---|---|
| 5,235,139 | A | 8/1993 | Bengston et al. |
| 5,391,924 | A | 2/1995 | Uchida et al. |
| 6,239,479 | B1 * | 5/2001 | Hwang et al. ............... 257/659 |
| 6,403,882 | B1 | 6/2002 | Chen et al. |
| 6,768,198 | B1 | 7/2004 | Blish, II et al. |
| 2005/0013082 | A1 | 1/2005 | Kawamoto et al. |
| 2005/0205953 | A1 | 9/2005 | Nakamura et al. |
| 2007/0230131 | A1 | 10/2007 | Bunyan |
| 2009/0176362 | A1 * | 7/2009 | Akram et al. ............... 438/612 |
| 2010/0327417 | A1 | 12/2010 | Fogle et al. |
| 2011/0303836 | A1 * | 12/2011 | Gibson ....................... 250/267 |

FOREIGN PATENT DOCUMENTS

| | | |
|---|---|---|
| EP | 0812013 A2 | 12/1997 |
| EP | 1266936 A1 | 12/2002 |
| EP | 2036860 A1 | 3/2009 |
| JP | 2001-255379 A | 9/2001 |
| JP | 2008172054 A | 7/2008 |
| WO | 0243456 A2 | 5/2002 |
| WO | 2006036548 A2 | 4/2006 |

OTHER PUBLICATIONS

Blish, II, Richard C. et al., "Filter Optimization for X-ray Inspection of Surface-Mounted ICs," IEEE 40th Annual International Reliability Physics Symposium, Dallas, TX, Apr. 11, 2002, pp. 377-379.
Blish, II, Richard C. et al., "Filter Optimization for X-ray Inspection of Surface-Mounted ICs," IEEE Transactions of Device and Materials Reliability, vol. 2, No. 4, Dec. 2002, pp. 102-106.
Blish, Richard, "Dose Minimization During X-ray Inspection of Surface-Mounted Flash ICs," Application Note, Spansion, Publication No. Dose_Minimization_AN, rev. 1, Oct. 10, 2008, 4 pages.
International Search Report and Written Opinion of the International Searching Authority for International Application No. PCT/US2013/040904, mailed Sep. 5, 2013.

* cited by examiner

*Primary Examiner* — Nicole Ippolito
(74) *Attorney, Agent, or Firm* — Sterne, Kessler, Goldstein & Fox P.L.L.C.

(57) ABSTRACT

An assembly includes an integrated circuit, a film layer disposed over the integrated circuit and having a thickness of at least 50 microns, and a thermal neutron absorber layer comprising at least 0.5% thermal neutron absorber. The thermal neutron absorber layer can be a glass layer or can include a molding compound.

21 Claims, 2 Drawing Sheets

SOFT ERROR RESISTANT CIRCUITRY

FIELD OF THE DISCLOSURE

This disclosure, in general, relates to packaged circuitry and assemblies having resistance to soft errors and methods of forming such circuitries and assemblies.

BACKGROUND

Society is increasingly reliant on computers and various computational devices. Moreover, the use of data storage and the transfer data through computer networks utilized by such computational devices has increased dramatically. As such, data integrity has become a growing issue in an ever-increasing data rich environment. Unfortunately, data integrity can be influenced by soft errors introduced during the transfer or storage of data.

Soft errors are errors in a signal or datum. Such errors typically represent an error in the data itself, but not physical damage to the system or a computational device. Soft errors can occur at a system-level, particularly during data transfer, in which noise within the system changes the value of the data. Erroneous data can be sent to memory and can cause problems at a later time. In another example, soft errors can be caused by alpha particle radiation that can hit memory cells and cause a change in the state of the cell. Such soft errors can change instructions within a program or can corrupt data. As such, soft errors can result in reduced reliability of a system or loss of information.

In particular, soft errors can be induced by alpha particle radiation. As such, integrated circuits are packaged using molding compounds that are free of alpha particle emitters, such as uranium, thorium, or boron-10. In the event that boron is used as a filer, the boron source includes little or no boron-10.

SUMMARY

In a first aspect, an assembly includes an integrated circuit, a film layer disposed over the integrated circuit and having a thickness of at least 50 microns, and a thermal neutron absorber layer comprising at least 0.5% thermal neutron absorber.

In a second aspect, a method of forming an electronic assembly includes dispensing an integrated circuit; depositing a film layer over the integrated circuit, the film layer having a thickness of at least 50 micrometers; and placing a thermal neutron absorber layer over the film layer, the thermal neutron absorber layer having at least 0.5% thermal neutron absorber.

In a third aspect, an assembly includes an integrated circuit; a film layer disposed over the integrated circuit and having a thickness of at least 50 microns; and a thermal neutron absorber glass layer comprising at least 0.5% thermal neutron absorber.

In a fourth aspect, a method of forming an electronic assembly includes dispensing an integrated circuit; depositing a film layer over the integrated circuit, the film layer having a thickness of at least 50 micrometers; and placing a thermal neutron absorber glass layer over the film layer, the thermal neutron absorber glass layer having at least 0.5% thermal neutron absorber.

In a fifth aspect, an assembly includes an integrated circuit; a film layer disposed over the integrated circuit and having a thickness of at least 50 microns; and a molding-compound disposed over the film layer and including at least 0.5% thermal neutron absorber.

In a sixth aspect, a method of forming an electronic assembly includes dispensing an integrated circuit; forming a film layer over the integrated circuit, the film layer having a thickness of at least 70 microns; and forming a molding-compound over the film layer, the molding-compound including at least 0.5% thermal neutron absorber.

In an seventh aspect, an assembly includes an integrated circuit; a printed circuit board coupled to the integrated circuit board, the printed circuit board comprising thermal neutron absorber fibers including at least 0.5% thermal neutron absorber; and a die attach compound disposed between the integrated circuit and the printed circuit board.

In an eighth aspect, a method of forming an electronic assembly includes dispensing an integrated circuit; and coupling the integrated circuit to a printed circuit board with a die attach compound, the printed circuit board including at least 0.5% thermal neutron absorber.

In a ninth aspect, an assembly includes an integrated circuit; a printed circuit board coupled to the integrated circuit board, the printed circuit board including an electroless boron-nickel coating; and a die attach compound disposed between the integrated circuit and the printed circuit board.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an embodiment, an assembly includes an integrated circuit, a film layer disposed over the integrated circuit and a thermal neutron absorber layer disposed over the film layer. The film layer can be at least 50 μm thick. A thermal neutron absorber layer includes at least 0.5% by weight of a thermal neutron absorber. In an example, the thermal neutron absorber layer can be a glass layer containing thermal neutron absorbers. In another example, the thermal neutron absorber layer can be a molding compound layer or packaging disposed over the integrated circuit and the film layer. In another example, thermal neutron absorbers can be incorporated into fibers of a printed circuit board, filler within the die attach compound, or layers coating the printed circuit board.

In another embodiment, a method of forming an integrated circuit assembly can include depositing a film layer over the integrated circuit and forming a thermal neutron absorber layer over the film layer. A thermal neutron absorber layer can be a thermal neutron absorber-containing glass layer or can be a molding compound including a thermal neutron absorber filler. The method can also include attaching the integrated circuit to a printed circuit board using a die attach compound. In an example, the die attach compound can include thermal neutron absorber filler. In another example, the printed circuit board can include a thermal neutron absorber within the glass fibers of the printed circuit board or can include a coating including a thermal neutron absorbers on the printed circuit board.

While integrated circuit assemblies are conventionally formed with little or no alpha particle emitters, a finite number of soft errors are still experienced. It is been discovered that such soft errors can be attributed to thermal neutrons. It has been further discovered that use of thermal neutron absorbers in packaging layers disposed at least 50 lam from an integrated circuit can act to absorb thermal neutrons and reduce soft errors. Despite being potential emitters of charged particles, it is been found that thermal neutron absorbers, such as boron-10, gadolinium-157, or cadmium-113, can absorb thermal neutrons and can reduce radiation related soft errors when disposed within layers positioned least 50 µm and more specifically, at least 60 µm from a surface of an integrated circuit. Thus, counter to conventional wisdom, the present devices incorporate thermal neutron absorbers despite the potential for emission of alpha particles.

Figure 1:
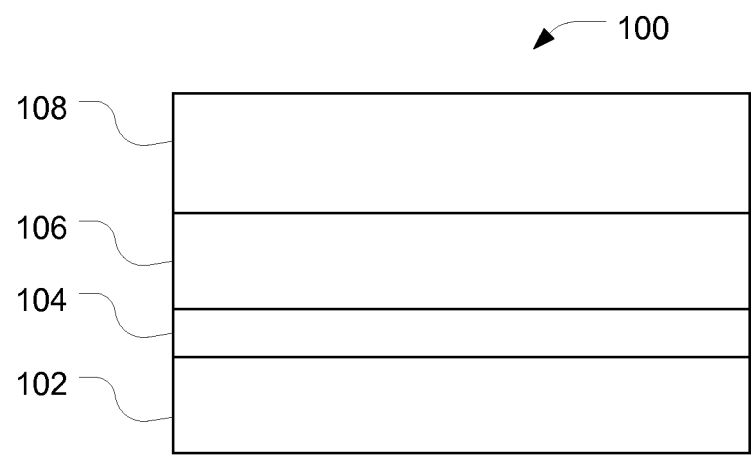
FIG. 1 includes an illustration of exemplary packaged circuitry.

As illustrated in FIG. 1, a packaged integrated circuit 100 can include an integrated circuit 102. In a particular example, the integrated circuit 102 includes transistors, diodes, capacitors and other charge carrying devices. One or more of such devices can be used to form a memory cell.

The integrated circuit 102 can have a thickness of at least 150 µm, such as at least 170 µm, at least 200 µm, at least 240 µm, or even at least 280 µm. The integrated circuit 102 can be formed in a substrate, such as a silicon substrate. Alternatively, the integrated circuit 102 can be formed in a printed circuit board or thin, small-outline packages (TSOP).

A film layer 104, such as a film-over-wire layer, can be disposed over a major surface of the integrated circuit 102. In an example, the film layer 104 can be formed of a polymeric material, such as polyester, polyamide, polyphenylene sulfide, polyphenylene oxide, silicone, phenolic resin, epoxy, acrylate, acrylonitrile-butadiene copolymer, polyimide, polyurethane, polyolefin, or a combination thereof. In particular, the polymer can be an epoxy. In another example, the polymer can be a polyimide. In a further example, the polymer can be silicone. The polymeric material can be filled with silica, alumina, aluminum trihydrate, carbon black, graphite, beryllium oxide, calcium silicate, zinc oxide, titanium oxide, magnesium oxide, silicon nitride, zinc, copper, silver, or a combination thereof. In an alternative example, the polymeric material can be free of filler. In particular, the polymeric material is free of alpha emitters, such as boron-10, uranium, or thorium.

In a further example, the film layer 104 can have a thickness of at least 50 µm. For example, the thickness of the film layer 104 can be at least 60 µm, such as at least 70 µm.

Optionally, a glass layer 106 can be disposed over the film layer 104. For example, the glass layer 106 can contain thermal neutron absorbers. In particular, the glass layer 106 can include at least 0.5% by weight of a thermal neutron absorber. Compositional weight percent is determined based on the weight of the thermal neutron absorber atomic specie within the material forming the layer containing the thermal neutron absorber atomic specie. For example, the glass layer 106 can include at least 0.8% by weight of the thermal neutron absorber, such as at least 1.1%, at least 1.6%, or even at least 2.2% by weight of the thermal neutron absorber. In a particular example, the thermal neutron absorber can include boron-10, gadolinium-157, or cadmium-113, or any combination thereof. In particular example, the thermal neutron absorber includes boron-10. Such boron-10 can be sourced from natural sources or can be sourced from enriched sources that include more boron-10 than is typically found in nature. As such, the boron source can include at least 20% by weight of boron-10, such as at least 25% or even at least 28% by weight of boron-10. In a particular example, the glass layer 106 can include borosilicate glass.

The glass layer 106 can have a thickness of at least 70 µm. For example, the glass layer 106 can have a thickness of at least 100 µm, such as a least 120 µm.

A molding compound layer 108 can be disposed over the film layer 104 and optionally the glass layer 106. For example, the molding compound can be formed of polyester, polyamide, polyphenylene sulfide, polyphenylene oxide, silicone, phenolic resin, epoxy, acrylate, acrylonitrile-butadiene copolymer, polyimide, polyurethane, polyolefin, or a combination thereof. In particular, the polymer can be an epoxy. In another example, the polymer can be a polyimide. In a further example, the polymer can be silicone.

Optionally, the molding compound can include at least 0.5% by weight of the thermal neutron absorber. For example, the molding compound can include at least 0.8% by weight, such as at least 1.1%, at least 1.6%, or even at least 2.2% by weight of the thermal neutron absorber. The thermal neutron absorber can be selected from the thermal neutron absorbers described above. In an example, the thermal neutron absorber can be introduced as a filler. An exemplary filler includes silica borate glass; metal borate, such as barium borate, zinc borate, calcium borate, sodium borate, or a combination thereof; boric acid; boron; an oxide of boron; gadolinium; gadolinium fluoride; an orthophosphate of gadolinium; a fluoride carbonate of gadolinium; cadmium; cadmium sulfate; or a combination thereof.

The molding compound layer 108 can have a thickness of at least 100 µm. For example, the molding compound layer can have a thickness at least 160 µm, such as at least 200 µm.

Figure 2:
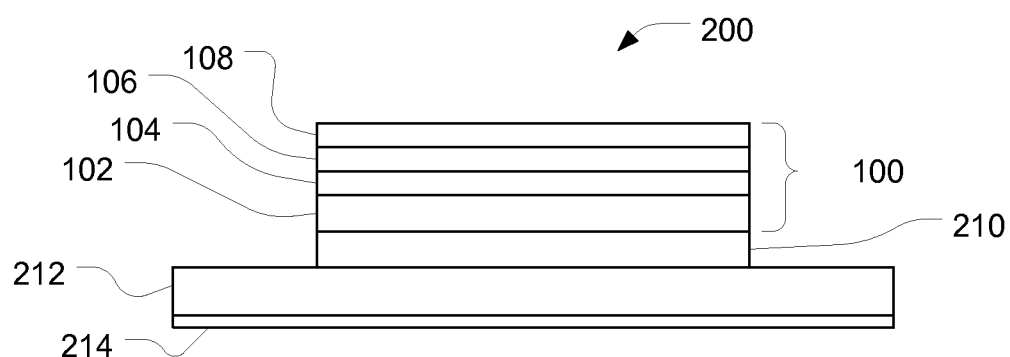
FIG. 2 includes an illustration of exemplary assembly.

Optionally, the integrated circuit package 100 can be coupled to a printed circuit board 212, as illustrated in FIG. 2. In particular, an assembly 200 includes the packaged integrated circuit 100 coupled to the printed circuit board 212 by a die attach compound 210. As illustrated, the printed circuit board 212 is coupled to the integrated circuit 102 on an opposite major surface from the film layer 104.

In an example, the printed circuit board 212 can also incorporate thermal neutron absorbers. For example, the printed circuit board 212 can include thermal neutron absorber-containing fibers including at least 0.5% by weight of thermal neutron absorber. For example, such thermal neutron absorber-containing fibers can include at least 0.8% by weight, such as at least 1.1%, at least 1.6%, or even at least 2.2% by weight of the thermal neutron absorber. The thermal neutron absorber can be selected from the group described above. In a particular example, the thermal neutron absorber is boron-10 and is incorporated into fibers of borosilicate glass. In an alternative example, the printed circuit board 212 can incorporate thermal neutron absorber filler, such as those described above.

The printed circuit board 212 can have a thickness of at least 100 µm. For example, the printed circuit board 212 can be at least 170 µm, such as at least 200 µm.

In another example, the printed circuit board 212 can include one or more coatings 214 that incorporate thermal neutron absorbers. As illustrated, the coating 214 is disposed on the printed circuit board 212 on a side opposite the integrated circuit 102. Alternatively, the coating 214 can be disposed on the same side of the printed circuit board 212 as the integrated circuit 102. In an example, the coating 214 can be a polymeric coating incorporating thermal neutron absorbers in amounts of at least 0.5% by weight. For example, the coating 214 can include the thermal neutron absorbers in amounts of at least 0.8% by weight, such as at least 1.1%, at least 1.6%, or even at least 2.2% by weight.

In another example, the coating 214 can be an electroless boron-nickel coating. Such an electroless boron-nickel coating can incorporate a thermal neutron absorber such as boron-10 in the amounts described in relationship to the polymeric coating described above. Further, the electroless boron-nickel coating can include thermal absorbers such as boron-10 in amounts of at least 5% by weight, such as at least 8% by weight.

Thermal neutron absorber can be incorporated into the die attach compound 210. For example, the die attach compound 210 can be formed of a polymeric material such as polyester, polyamide, polyphenylene sulfide, polyphenylene oxide, silicone, phenolic resin, epoxy, acrylate, acrylonitrile-butadiene copolymer, polyimide, polyurethane, polyolefin, or a combination thereof. In particular, the polymeric material can be an epoxy. In another example, the polymeric material can be a polyimide. In a further example, the polymeric material can be silicone. In an example, the die attach compound 210 can include thermal neutron absorber in an amount of 0.5% by weight, such as at least 0.8%, at least 1.1%, at least 1.6%, or even at least 2.2% by weight. The thermal neutron absorber can be selected from the thermal neutron absorbers described above. In a particular example, the die attach compound 210 can include a source of boron, such as a non-water soluble boron dopant. An exemplary non-water-soluble boron doping can include barium borate.

While not illustrated, the assembly 200 can further include lead frames, such as copper lead frames. Similarly, the assembly 200 can include additional molding compound disposed over or under various layers of the assembly 200.

Figure 3:
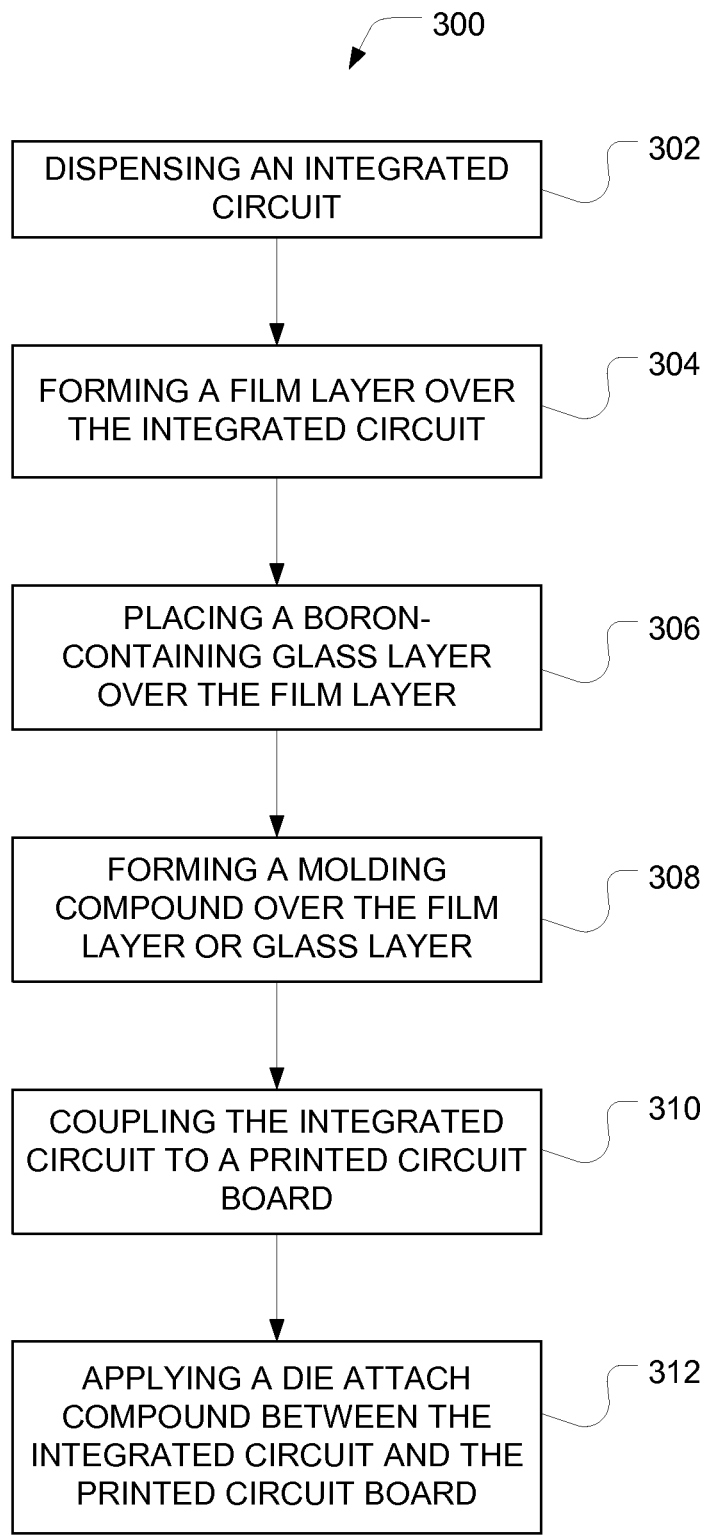
FIG. 3 includes a block flow diagram of an exemplary method for making an assembly.

As illustrated in FIG. 3, the assembly can be formed by a method 300 including dispensing an integrated circuit, as illustrated at 302. As illustrated at 304, a film layer, such as a film-over-wire layer can be formed over the integrated circuit. In an example, the film-over-wire layer is at least 50 μm thick and is free of alpha particle emitters.

Optionally, a thermal neutron absorber-containing glass layer is disposed over the film layer, as illustrated at 306. The thermal neutron absorber-containing glass layer can, for example, include borosilicate glass.

A molding compound can be disposed over the film layer or over the optional glass layer, as illustrated at 308. In an example, the molding compound can include a thermal neutron absorber in an amount of at least 0.5% by weight.

The integrated circuit can be coupled to a printed circuit board, as illustrated at 310. In an example, the printed circuit board can include thermal neutron absorber, such as in an amount of at least 0.5% by weight. For example, the printed circuit board can include a borosilicate glass fiber or can include a coating, such as electroless boron-nickel coating including at least 0.5% by weight of the thermal neutron absorber.

A die attach compound can be applied between the integrated circuit the printed circuit board to secure the integrated circuit to the printed circuit board, as illustrated at 312. In an example, the die attach compound can include a thermal neutron absorber in an amount of at least 0.5% by weight. In particular, the thermal neutron absorber can include a non-water-soluble boron source, such as barium borate. Optionally, an additional molding compound can be disposed around the assembly. Further, other structures can be included in the assembly, such as lead frames or additional printed circuit boards.

In a first aspect, an assembly includes an integrated circuit, a film layer disposed over the integrated circuit and having a thickness of at least 50 microns, and a thermal neutron absorber layer comprising at least 0.5% thermal neutron absorber.

In an example of the first aspect, the thermal neutron absorber layer includes at least 0.8% thermal neutron absorber. For example, the thermal neutron absorber glass can include at least 1.1% thermal neutron absorber, such as at least 1.6% thermal neutron absorber, or at least 2.2% thermal neutron absorber.

In another example of the first aspect and the above examples, the thermal neutron absorber includes boron-10.

In a further example of the first aspect and the above examples, the thermal neutron absorber includes gadolinium-157.

In an additional example of the first aspect and the above examples, the thermal neutron absorber includes cadmium-113.

In an example of the first aspect and the above examples, the thickness of the film layer is at least 60 microns. For example, the thickness of the film layer can be at least 70 microns.

In another example of the first aspect and the above examples, the film layer comprises a polymer selected from the group consisting of polyester, polyamide, polyphenylene sulfide, polyphenylene oxide, silicone, phenolic resin, epoxy, acrylate, acrylonitrile-butadiene copolymer, polyimide, polyurethane, polyolefin, or a combination thereof.

In a further example of the first aspect and the above examples, the thermal neutron absorber layer has a thickness of at least 70 microns.

In an additional example of the first aspect and the above examples, the thermal neutron absorber layer comprises borosilicate glass.

In an example of the first aspect and the above examples, the thermal neutron absorber layer comprises a molding compound.

In another example of the first aspect and the above examples, the assembly further includes a printed circuit board coupled to the integrated circuit opposite the film layer. For example, the assembly can further include a die attach compound disposed between the printed circuit board and the integrated circuit. In an additional example, the printed circuit board can include fibers comprising at least 0.5% of a thermal neutron absorber. In another example, the printed circuit board includes a electroless boron-nickel coating.

In a second aspect, a method of forming an electronic assembly includes dispensing an integrated circuit; depositing a film layer over the integrated circuit, the film layer having a thickness of at least 50 micrometers; and placing a thermal neutron absorber layer over the film layer, the thermal neutron absorber layer having at least 0.5% thermal neutron absorber.

In an example of the second aspect, the thermal neutron absorber layer includes a thermal neutron absorber glass layer.

In another example of the second aspect and the above examples, the thermal neutron absorber layer includes a molding compound.

In a further example of the second aspect and the above examples, the method further includes coupling the integrated circuit to a printed circuit board.

In a third aspect, an assembly includes an integrated circuit; a film layer disposed over the integrated circuit and having a thickness of at least 50 microns; and a thermal neutron absorber glass layer comprising at least 0.5% thermal neutron absorber.

In an example of the third aspect, the thermal neutron absorber glass layer includes at least 0.8% thermal neutron absorber. For example, the thermal neutron absorber glass layer can include at least 1.1% thermal neutron absorber, such as at least 1.6% thermal neutron absorber or at least 2.2% thermal neutron absorber.

In another example of the third aspect and the above examples, the thermal neutron absorber includes boron-10.

In a further example of the third aspect and the above examples, the thermal neutron absorber includes gadolinium-157.

In an additional example of the third aspect and the above examples, the thermal neutron absorber includes cadmium-113.

In an example of the third aspect and the above examples, the thickness of the film layer is at least 60 microns. For example, the thickness of the film layer can be at least 70 microns.

In another example of the third aspect and the above examples, the thermal neutron absorber glass layer has a thickness of at least 70 microns. For example, the thermal neutron absorber glass layer can have a thickness of at least 100 microns, such as at least 120 microns.

In a further example of the third aspect and the above examples, the thermal neutron absorber glass layer comprises borosilicate glass.

In an additional example of the third aspect and the above examples, the assembly further includes a molding compound disposed over the thermal neutron absorber glass layer. For example, the molding compound can include at least 0.5% of a thermal neutron absorber.

In an example of the third aspect and the above examples, the assembly further includes a printed circuit board coupled to the integrated circuit opposite the film layer. For example, the assembly can further include a die attach compound disposed between the printed circuit board and the integrated circuit. In another example, the printed circuit board includes fibers comprising at least 0.5% of a thermal neutron absorber. In a further example, the printed circuit board includes a electroless boron-nickel coating.

In a fourth aspect, a method of forming an electronic assembly includes dispensing an integrated circuit; depositing a film layer over the integrated circuit, the film layer having a thickness of at least 50 micrometers; and placing a thermal neutron absorber glass layer over the film layer, the thermal neutron absorber glass layer having at least 0.5% thermal neutron absorber.

In an example of the fourth aspect, the method further includes depositing a molding compound over the thermal neutron absorber glass layer.

In another example of the fourth aspect and the above examples, the method further includes coupling the integrated circuit to a printed circuit board.

In a fifth aspect, an assembly includes an integrated circuit; a film layer disposed over the integrated circuit and having a thickness of at least 50 microns; and a molding-compound disposed over the film layer and including at least 0.5% thermal neutron absorber.

In an example of the fifth aspect, the molding-compound includes at least 0.8% thermal neutron absorber. For example, the molding-compound includes at least 1.1% thermal neutron absorber, such as at least 1.6% thermal neutron absorber or at least 2.2% thermal neutron absorber.

In another example of the fifth aspect and the above examples, the thickness of the film layer is at least 60 microns, such as at least 70 microns, or at least 100 microns.

In an additional example of the fifth aspect and the above examples, the molding-compound has a thickness of at least 160 microns, such as at least 200 microns.

In a further example of the fifth aspect and the above examples, the molding-compound comprises a polymer selected from the group consisting of polyester, polyamide, polyphenylene sulfide, polyphenylene oxide, silicone, phenolic resin, epoxy, acrylate, acrylonitrile-butadiene copolymer, polyimide, polyurethane, polyolefin, or a combination thereof.

In an example of the fifth aspect and the above examples, the assembly further includes a printed circuit board coupled to the integrated circuit opposite the film layer. For example, the assembly can further include a die attach compound disposed between the printed circuit board and the integrated circuit. In another example, the printed circuit board can include fibers comprising at least 0.5% thermal neutron absorber. In an additional example, the printed circuit board includes an electroless boron-nickel coating.

In a sixth aspect, a method of forming an electronic assembly includes dispensing an integrated circuit; forming a film layer over the integrated circuit, the film layer having a thickness of at least 70 microns; and forming a molding-compound over the film layer, the molding-compound including at least 0.5% thermal neutron absorber.

In an example of the sixth aspect, the method further includes coupling the integrated circuit to a printed circuit board.

In another example of the sixth aspect and the above examples, the printed circuit board includes fibers having at least 0.5% thermal neutron absorber.

In a further example of the sixth aspect and the above examples, coupling the integrated circuit board to the printed circuit board includes coupling with a die attached compound including at least 0.5% thermal neutron absorber.

In an seventh aspect, an assembly includes an integrated circuit; a printed circuit board coupled to the integrated circuit board, the printed circuit board comprising thermal neutron absorber fibers including at least 0.5% thermal neutron absorber; and a die attach compound disposed between the integrated circuit and the printed circuit board.

In an example of the seventh aspect, the thermal neutron absorber fibers include at least 0.8% thermal neutron absorber. For example, the thermal neutron absorber fibers include at least 1.1% thermal neutron absorber, such as at least 1.6% thermal neutron absorber or at least 2.2% thermal neutron absorber.

In another example of the seventh aspect and the above examples, the thickness of the printed circuit board is at least 100 microns. For example, the thickness of the printed circuit board can be at least 170 microns.

In a further example of the seventh aspect and the above examples, the thermal neutron absorber fibers comprise borosilicate glass.

In an additional example of the seventh aspect and the above examples, the assembly further includes a molding-compound disposed over the integrated circuit. In an example, the molding compound comprises at least 0.5% thermal neutron absorber.

In another example of the seventh aspect and the above examples, the printed circuit board includes an electroless boron-nickel coating.

In an eighth aspect, a method of forming an electronic assembly includes dispensing an integrated circuit; and coupling the integrated circuit to a printed circuit board with a die attach compound, the printed circuit board including at least 0.5% thermal neutron absorber.

In a ninth aspect, an assembly includes an integrated circuit; a printed circuit board coupled to the integrated circuit board, the printed circuit board including an electroless boron-nickel coating; and a die attach compound disposed between the integrated circuit and the printed circuit board.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. An apparatus comprising:
    an integrated circuit;
    one or more layers disposed over the integrated circuit; and
    a thermal neutron absorber layer, disposed over the one or more layers, comprising thermal neutron absorbing material wherein a combined thickness of the one or more layers is at least 50 microns so as to decrease an effect on the integrated circuit by a particle emitted from the thermal neutron absorber layer.

2. The apparatus of claim 1, wherein the thermal neutron absorbing material comprises at least 0.5% thermal neutron absorbing material.

3. The apparatus of claim 1, wherein the thermal neutron absorbing material comprises boron-10.

4. The apparatus of claim wherein the one or more layers comprises at least one of polyester, polyamide, polyphenylene sulfide, polyphenylene oxide, silicone, phenolic resin, epoxy, acrylate, acrylonitrile-butadiene copolymer, polyimide, polyurethane, and polyolefin, or a combination thereof.

5. The apparatus of claim 1, wherein the thermal neutron absorber layer has a thickness of at least 70 microns.

6. The apparatus of claim 1, wherein the thermal neutron absorber layer comprises borosilieate glass.

7. The apparatus of claim 1, wherein the thermal neutron absorber layer comprises a molding compound.

8. The apparatus of claim 1, further comprising a printed circuit board coupled. to the integrated circuit opposite the neutron absorber free layer.

9. The apparatus of claim 8, wherein the printed circuit board includes fibers comprising at least 0.5% of a thermal neutron absorbing material.

10. The apparatus of claim 8, wherein the printed circuit board comprises an electroless boron-nickel coating.

11. A method comprising:
    dispensing an integrated circuit;
    depositing one or more layers over the integrated circuit; and
    placing a thermal neutron absorber layer over the one or more layers, the thermal neutron absorber layer having thermal neutron absorbing material, wherein a combined thickness of the one or more layers is at least 50 microns so as to decrease an effect on the integrated circuit by a particle emitted from the thermal neutron absorber layer.

12. The method of claim 11, wherein the placing comprises placing a thermal neutron absorber layer, the thermal neutron absorber layer also comprising borosilicate glass.

13. The method of claim 11 wherein the placing comprises placing a thermal neutron absorber layer, the thermal neutron absorber layer also comprising a molding compound.

14. The method of claim 11, further comprising coupling the integrated circuit to a printed circuit board.

15. An apparatus comprising:
    an integrated circuit;
    one or more layers disposed over the integrated circuit; and
    a thermal neutron absorber glass layer, disposed over the one or more layers, comprising thermal neutron absorbing material, wherein a combined thickness of one or more layers is at least 50 microns so as to decrease an effect integrated circuit by a particle emitted from the thermal neutron absorber layer.

16. The apparatus of claim 15, wherein the thermal neutron absorbing material includes boron-10.

17. The apparatus of claim 15, wherein the thermal neutron absorber glass layer has a thickness of at least 70 microns.

18. The apparatus of claim 15, wherein the thermal neutron absorber glass layer comprises borosilicate glass.

19. The apparatus of claim 15, further comprising a molding compound disposed over the thermal neutron absorber glass layer, the molding compound. comprising at least 0.5% of a thermal neutron absorbing material.

20. The apparatus of claim 15, further comprising a printed circuit board coupled to the integrated circuit opposite the neutron absorber free layer, wherein the printed circuit board includes fibers comprising at least 0.5% of a thermal neutron absorbing material.

21. The apparatus of claim 20, wherein the printed circuit board comprises an electroless boron-nickel coating.

\* \* \* \* \*